United States Patent
Grespan et al.

(10) Patent No.: US 9,101,083 B2
(45) Date of Patent: Aug. 4, 2015

(54) T-FLEX BONDER

(75) Inventors: Silvio Grespan, Cupertino, CA (US);
Shih-Min Hsu, Cupertino, CA (US);
Heng-Hsi Wu, Cupertino, CA (US);
Kuo-Hua Sung, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 241 days.

(21) Appl. No.: 13/609,248

(22) Filed: Sep. 10, 2012

(65) Prior Publication Data

US 2014/0069567 A1    Mar. 13, 2014

(51) Int. Cl.
*B32B 41/00* (2006.01)
*H05K 3/32* (2006.01)
*H05K 3/36* (2006.01)
*H05K 3/00* (2006.01)

(52) U.S. Cl.
CPC *H05K 3/32* (2013.01); *B32B 41/00* (2013.01); *H05K 3/361* (2013.01); *H05K 3/0008* (2013.01); *H05K 3/323* (2013.01); *H05K 2201/09918* (2013.01); *H05K 2201/10136* (2013.01); *H05K 2203/082* (2013.01)

(58) Field of Classification Search
CPC .. G02B 6/4224; G02B 6/4227; G02B 6/4236; H01L 2223/54426; H05K 1/0393

USPC .......... 156/64, 290, 291, 295, 350, 378, 379; 439/118; 29/759, 760, 833, 834
See application file for complete search history.

(56) References Cited

U.S. PATENT DOCUMENTS

| | | | |
|---|---|---|---|
| 5,217,550 A * | 6/1993 | Takeuchi et al. | 156/64 |
| 5,539,848 A | 7/1996 | Galloway | |
| 5,672,816 A * | 9/1997 | Park et al. | 73/105 |
| 5,790,733 A | 8/1998 | Smith et al. | |
| 6,198,525 B1 | 3/2001 | Barringer et al. | |
| 6,541,852 B2 | 4/2003 | Beroz et al. | |
| 7,345,244 B2 * | 3/2008 | Shiraishi | 174/254 |
| 2013/0180764 A1 * | 7/2013 | Wurzel et al. | 174/254 |

FOREIGN PATENT DOCUMENTS

EP    0968447    11/1997

* cited by examiner

*Primary Examiner* — Michael N Orlando
*Assistant Examiner* — Joshel Rivera
(74) *Attorney, Agent, or Firm* — Downey Band LLP (57) ABSTRACT

A flexible circuit with multiple independent mounting points can be mounted (soldered) to substrates by independently (and concurrently) positioning mounting points in x, y, and theta (angular rotation) with vacuum chucks. In one embodiment the vacuum chucks can be guided by computer aided vision to locate and match fiducials on the flex circuit with fiducials on the substrate. In one embodiment, hot bars can be used in a subsequent bonding operation to secure an adhesive coupling between the flexible circuits and the substrate.

14 Claims, 9 Drawing Sheets

T-FLEX BONDER

BACKGROUND

1. Technical Field

The described embodiments relate generally to a method and apparatus for attaching a flexible PCB to a number of positions on an LCD assembly. More specifically the disclosure describes a method for precisely attaching the flexible PCB around an obstruction

2. Related Art

Compact computing devices such as laptop computers, smart phones, etc. have become ever smaller, lighter and more powerful. One factor contributing to this reduction in size can be attributed to the manufacturer's ability to fabricate various components of these devices in smaller and smaller sizes, assembling the components in ever more dense configurations, and in most cases increasing the power and or operating speed of such components. In many cases the close packing of components can result in obstructions making routing of cables and connectors particularly challenging. While flexible printed circuit boards (PCBs) can assist in easing such routing problems unfortunately the overall flexibility of the flexible printed circuit boards themselves can make precise placement of those flexible PCBs more challenging. Precise placement becomes even more challenging when a routing path for the PCB needs to lie up along a very specific path.

Therefore, a method for precise placement of a flexible PCB within a larger electronic device is desired.

SUMMARY

The embodiments relate to a method, system, and computer readable medium for accurately and efficiently attaching a flexible circuit to a display assembly.

In one embodiment, a method for aligning and bonding a flexible circuit having a number of attaching surfaces to a number of mounting areas is disclosed. The method including at least the following steps: (1) securing the flexible circuit to a securing mechanism, the securing mechanism having at least as many securing areas as there are attaching surfaces; (2) concurrently lifting a first attaching surface and a second attaching surface using the securing mechanism; (3) using an optical guidance system to direct the securing mechanism in aligning the first attaching surface with a first mounting area and independently aligning the second attaching surface with a second mounting area; and (4) bonding the first attaching surface to the first mounting area and the second attaching surface to the second mounting area.

In another embodiment a system for electrically coupling a flexible circuit to a plurality of electrical contacts arranged on a display assembly is disclosed, including at least the following: (1) an optical guidance system comprising a plurality of CCD cameras arranged to observe fiducials disposed on a first surface of the display assembly and corresponding fiducials disposed on the flexible circuit; (2) a number of vacuum chucks configured to independently maneuver a number of attaching surfaces of the flexible circuit until a number of fiducial marks on the flexible circuit are in alignment with corresponding fiducial marks on the first surface of the display assembly; and (3) a plurality of hot bars configured to adhesively and electrically couple the number of attaching surfaces to associated electrical contacts arranged on the display assembly by a conductive, pressure sensitive adhesive.

In yet another embodiment a non-transitory computer readable medium for storing computer instructions executed by a processor in a computing device is disclosed. The non-transitory computer readable medium includes at least the following: (1) computer code for pre-bending a flexible circuit, the flexible circuit comprising a first and second attachment surface; (2) computer code for concurrently aligning the first and second attachment surfaces to alignment indicia arranged on a first surface of an electrical component by independently maneuvering the first and second attachment surfaces with a first vacuum chuck attached to the first attachment surface and a second vacuum chuck attached to the second attachment surfaces; (3) computer code for pressing the first and second attachment surfaces onto the first surface of the electrical component, wherein the pressing of the first and second attachment surfaces onto the first surface of the electrical component pre-bonds the first and second attachment surfaces onto the first surface of the electrical component together; and (4) computer code for adhesively and electrically coupling the first and second attachment surfaces to the first surface of the electrical component by a plurality of hot bars.

BRIEF DESCRIPTION OF THE DRAWINGS

The described embodiments will be readily understood by the following detailed description in conjunction with the accompanying drawings, wherein like reference numerals designate like structural elements, and in which.

DETAILED DESCRIPTION

Reference will now be made in detail to selected embodiments an example of which is illustrated in the accompanying drawings. While the invention will be described in conjunction with a preferred embodiment, it will be understood that it is not intended to limit the invention to one preferred embodiment. To the contrary, it is intended to cover alternatives, modifications, and equivalents as can be included within the spirit and scope of the invention as defined by the appended claims.

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessarily obscuring the present invention.

As devices grow in complexity and functionality signal routing complexities can grow exponentially. Increasingly larger numbers of sensors and standalone component devices are required to communicate back and forth in a networked fashion, each communication channel sometimes requiring its own set of wires. While flexible printed circuits can allow for denser configurations, such flexible circuits can be difficult to place with the high precision standards demanded by modern electronic device manufacturers. One way to ensure that a flexible printed circuit is both predictably shaped and precisely positioned is to apply a preforming or and/or pre-bending operation in which a desired finished geometry is achieved by placing the flexible printed circuit on a stage device that can maneuver the flexible printed circuit into at least a shape very closely matching its final geometry. Once the geometry is achieved the flexible circuit can be moved to the electronic device itself for precise placement. In one embodiment the moving device is a set of vacuum chucks. By constraining attachment points of the flexible circuit in strict relation to one another a correct final geometry can be achieved once the flexible circuit is attached inside an electronic device. Precise positioning of the attachment points can be achieved by a robotic vision system including at least one Coupled Charged Device (CCD) cameras. In embodiments in which at least one of the attaching surfaces are transparent the at least one CCD can function as a form of feedback control to direct precise positioning of the flexible circuit prior to a pre-bonding step. By looking through the at least one transparent surface the CCD can give feedback about whether the fiducial marks on the flexible circuit properly align with corresponding fiducial marks located on the surface to which it will be attached. After the pre-bonding step is complete a final bonding operation can be applied involving both heat and pressure to be applied to maximize conductivity across an adhesive layer and to firmly set the adhesive between the flexible circuit and its targeted attachment points.

In one more specific embodiment a flexible circuit can be utilized to combine signals from various regions of a touch sensor matrix. The flexible circuit can be required when intervening components or limiting geometry prevents a solid printed circuit board (PCB) from being utilized to connect the various touch sensor outputs. In one embodiment attachment points for the flexible circuit have tight tolerances that need to be achieved so that in one extreme delicate parts are not crushed and in another extreme an insufficiently strong adhesive bond results. The vision system previously described can be utilized to achieve these strict tolerances; however, in certain cases CCD viewing positions can be altered by the use of optics to reposition the CCDs into positions in which there is sufficient space.

Various embodiments of flexible PCB attachment methods are discussed below with reference to FIGS. 1A-8. However, those skilled in the art will readily appreciate that the detailed description given herein with respect to these figures is for explanatory purposes as the full extent of the embodiments goes beyond these limited descriptions.

Figure 1A:
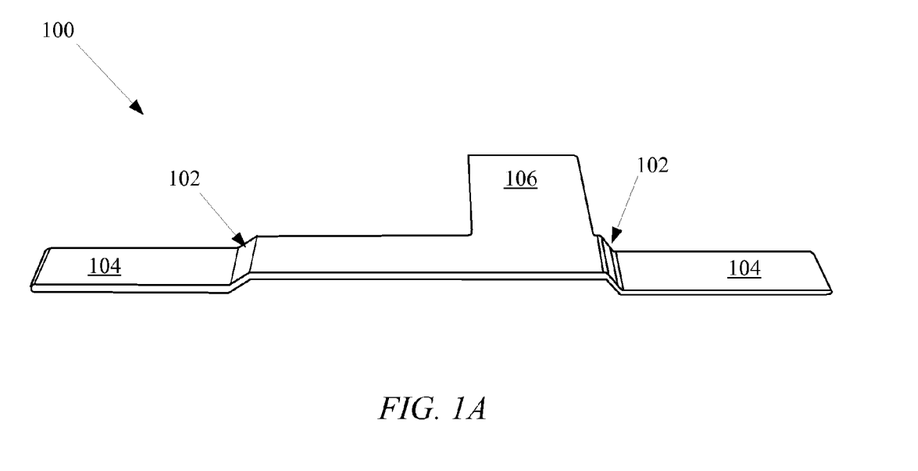
FIG. 1A illustrates a perspective view of a flexible circuit having a number of pre-bent portions designed to conform around an intervening structure.
Figure 1B:
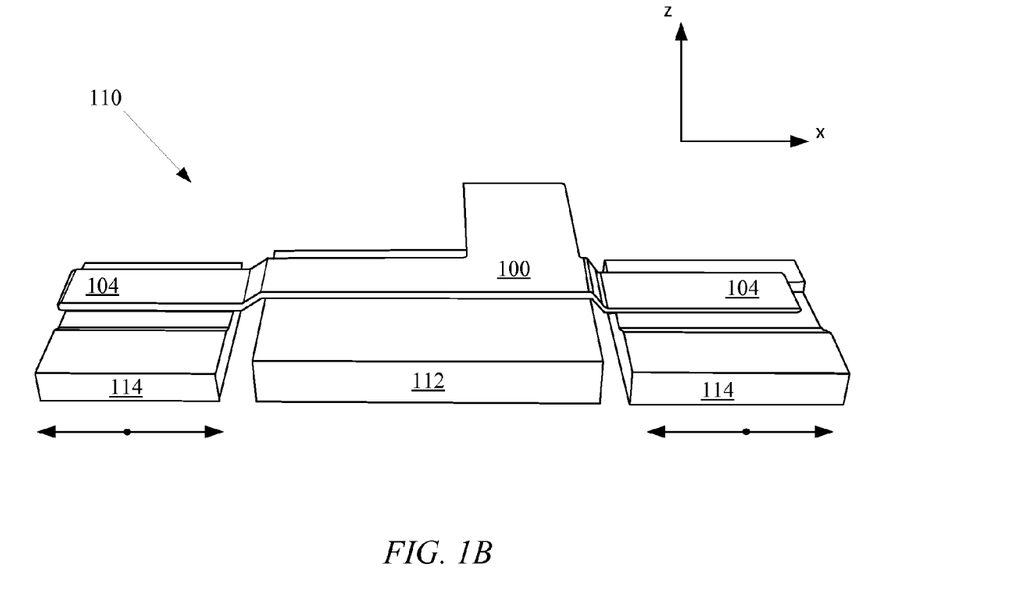
FIG. 1B illustrates a perspective view of a flexible circuit disposed across a precision stage for precisely arranging the flexible circuit prior to a bonding operation.

FIG. 1A illustrates flexible circuit 100 with a number of pre-bent portions 102. Pre-bent portions 102 are designed to allow flexible circuit 100 to be routed over an intervening obstruction, in one embodiment embodied as an integrated circuit. Flexible circuit 100 can be made completely from flexible PCB material. The flexible PCB material can be a flexible plastic substrate such as for example polyimide, PEEK (polyester ether ketone), or transparent conductive polyester film. In another embodiment flexible circuit 100 can be made from a combination of rigid and flexible materials, allowing only specific portions of flexible circuit 100 to bend and flex. Flexible circuit 100 can includes two attaching surfaces 104. Attaching surfaces 104 can include touch sensor connectors (not shown) disposed on a bottom surface of connection branches 104. In some embodiments of an electronic device with a touch sensor different inputs from different regions of the touch sensor are routed through different channels. The depicted pair of touch sensor connectors can merge signals from at least two different regions, thereby providing a processor or logic unit a combined set of inputs to be processed. Merged connector 106 can be configured to carry signals routed from attaching surfaces 104 to another component such as a main logic board for further processing. In FIG. 1B a precision stage 110 is illustrated for precisely arranging flexible circuit 100 prior to a bonding operation. Precision stage 110 can have a central element 112 flanked by two adjustable elements 114. Adjustable elements 114 can be precisely translated in the X-axis with respect to central element 112. In this way flexible circuit 100 can span a precision distance from one end to another.

Figure 1C:
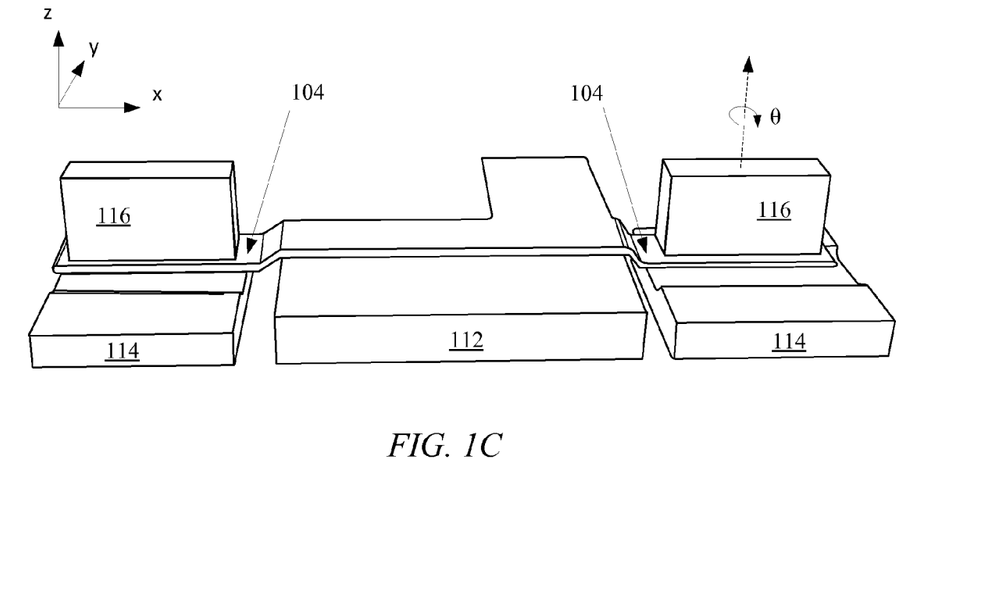
FIG. 1C illustrates a pair of vacuum chucks coupled by vacuum suction to a pair of attaching surfaces.
Figure 1D:
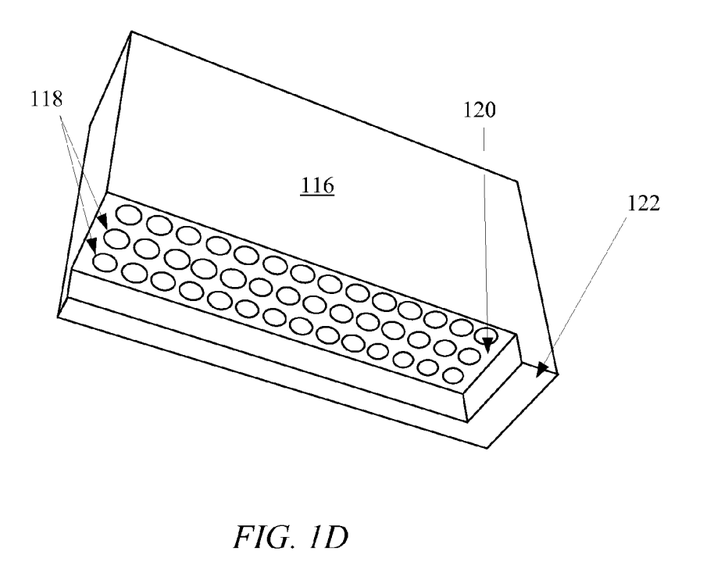
FIG. 1D illustrates a perspective view of a lower surface of a vacuum chuck.

FIG. 1C illustrates a pair of vacuum chucks 116 vacuum attached to attaching surfaces 104. Vacuum chucks 116 allow connection branches 104 to be maneuvered; each vacuum chuck can be independently maneuverable in at least a Y and $\theta$ axes. In such an embodiment a mating surface can maneuver in X and Z axes to facilitate contact between flexible circuit 100 and targeted touch sensor contacts. In some embodiments vacuum chucks 116 can be maneuverable in X, Y, Z and $\theta$ axes, thereby allowing vacuum chucks 116 to be responsible for all maneuvering of flexible circuit 100 with respect to target touch sensor contacts in a subsequent attachment procedure. FIG. 1D shows a perspective view of a bottom surface of vacuum chuck 116. For vacuum chuck 116 to attach effectively to flex circuit 100 the vacuum attachment should be sturdy enough to allow the attachment to withstand sheering forces caused by maneuvering of vacuum chuck 116 with respect to flex circuit 100. Attachment strength can be directly related to configuration of vacuum holes 118 and material composition of bottom surface 120. Vacuum chuck 116 can also include mechanical features 122 to help prevent slipping of flexible circuit 100 with respect to vacuum chuck 116 during a maneuvering operation.

Figure 2:
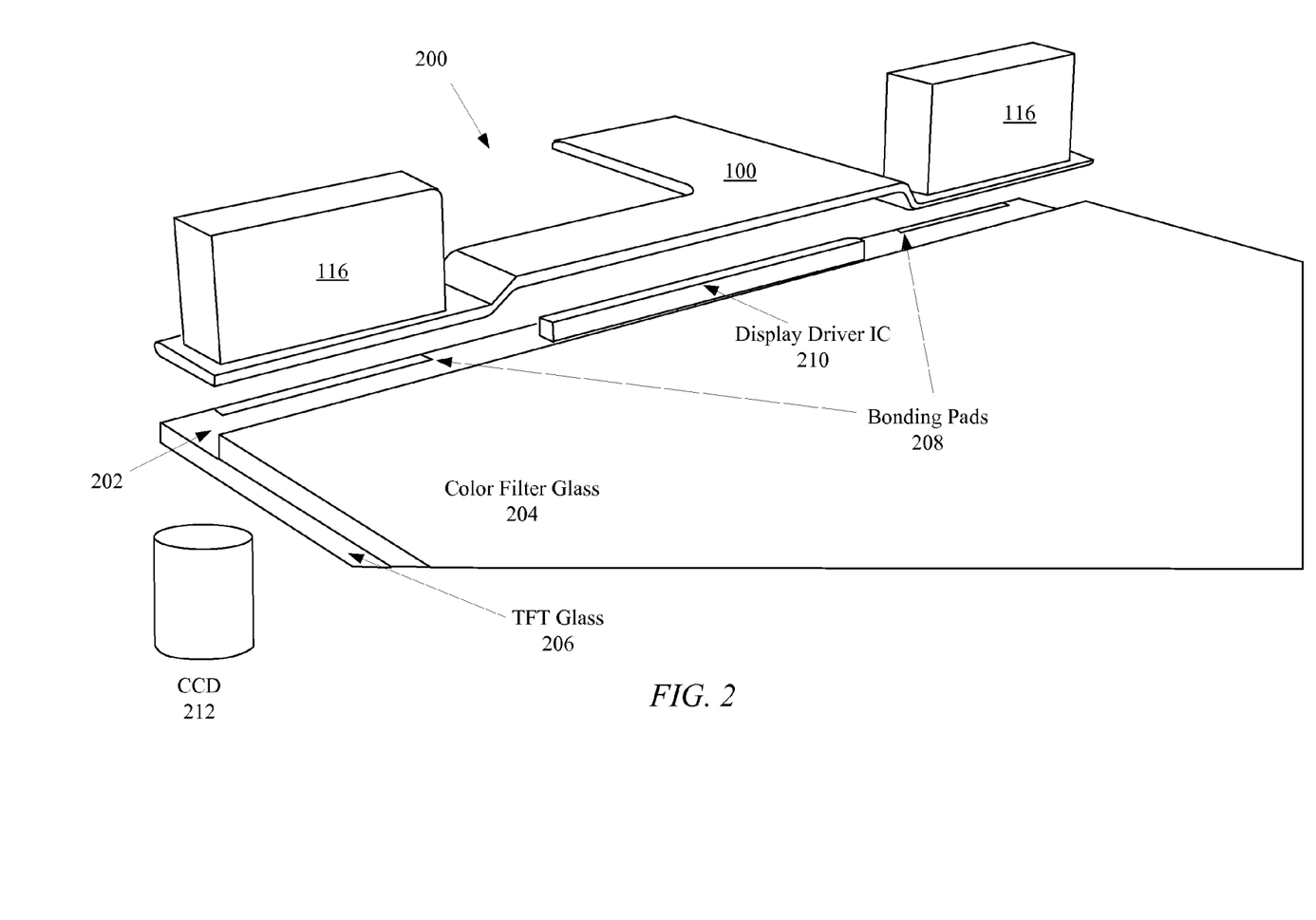
FIG. 2 illustrates a flexible circuit supported by vacuum chucks prior to a pre-bonding operation.

FIG. 2 illustrates flexible circuit 100 supported by vacuum chucks 116 just prior to a pre-bonding operation. Flexible circuit 100 reaches this position by being lifted off of precision stage 110 and moved over Thin Film Transistor (TFT) ledge 202 of display assembly 200. Vacuum chucks 116 can be configured to maintain a specific spacing established by precision stage 110 as it moves flexible circuit 100 from precision stage 110 to a position above display assembly 200. Display assembly 200 as depicted includes color filter glass 204 and TFT glass 206. Positioned on TFT ledge 202 of display assembly 200 are bonding pads 208. Bonding pads 208 include conductive adhesive strips arranged on top of touch sensor contacts (not shown). In one embodiment conductive adhesive strips can be pressure sensitive anisotropic conductive film (ACF). Conductivity through ACF is increased when pressure is applied as a result of conductive particles within the adhesive substrate being compressed together. In one embodiment ACF must be thermally activated to form a finalized bond. It should be noted that while the embodiments describe a TFT type LCD component display assembly any other display type such as for example AMOLED, or even more generally any electrical component benefiting from precise placement of flexible circuits to join a number of signals together is also within the scope of this disclosure.

Also depicted in FIG. 2 is display driver integrated circuit (IC) 210. Display driver IC 210 can be configured to power functionality within display assembly 200. Display driver IC 210 is the reason flexible circuit 100 is used since a flat and rigid circuit would not be able to conform with the physical obstruction caused by display driver IC 210. Once vacuum chucks 116 have established flexible circuit 100 above display assembly 200, vacuum chucks 116 can be maneuvered with reference to feedback provided by charged coupled device (CCD) 212. CCD 212 is a manufacturing camera that can be positioned about 10mm from a bottom surface of TFT glass 206. In this way CCD 212 can provide precise information regarding alignment of attaching surfaces 104 with bonding pads 208.

Figure 3A:
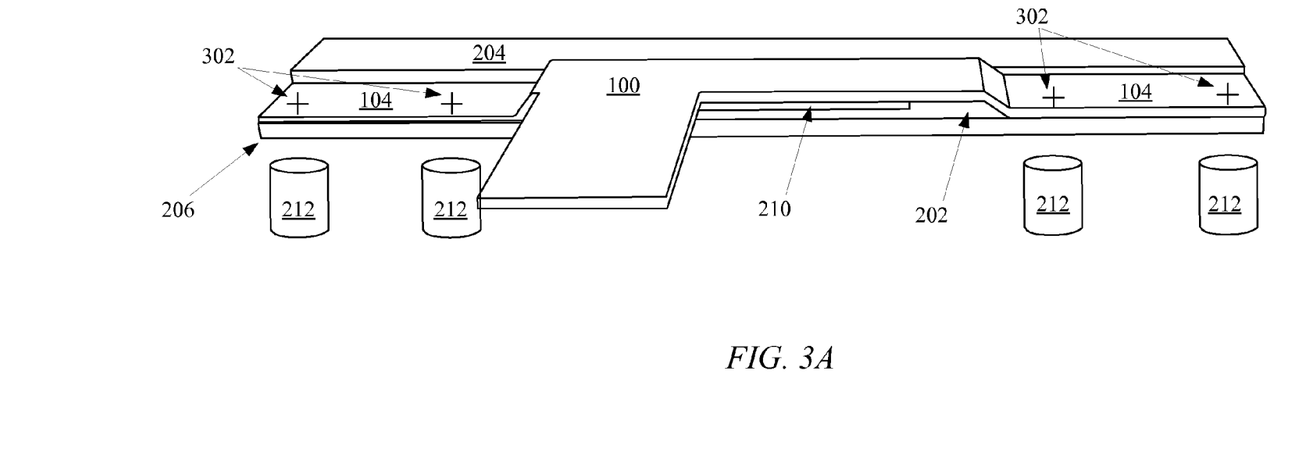
FIG. 3A illustrates a number of CCDs used for determining a correct position for a pair of attaching surfaces on a Thin Film Transistor (TFT) ledge.

FIG. 3A illustrates a number of CCDs 212. CCDs 212 are able to determine a correct position for attaching surfaces 104 on TFT ledge 202 by way of a number of fiducials 302 located on both TFT ledge 202 and attaching surfaces 104. In some embodiments where flexible circuit 100 is transparent CCDs 212 can be alternatively positioned above flexible circuit 100. Each attaching surface 104 can have at least two fiducials 302 which correspond to at least two fiducials 302 on TFT ledge 202. Although not depicted vacuum chucks 116 are used to maneuver attaching surfaces 104 until fiducials 302 are in alignment, at which point vacuum chuck 116 lowers its attaching surface 104 until it is in contact with bonding pad 208. This alignment and placement process can be configured to run in an automated fashion or manually. Once attaching surface 104 is in contact with bonding pad 208 vacuum chuck 116 can apply pressure to attaching surface 104 to establish a pre-bond between attaching surface 104 and bonding pad 208.

Figure 3B:
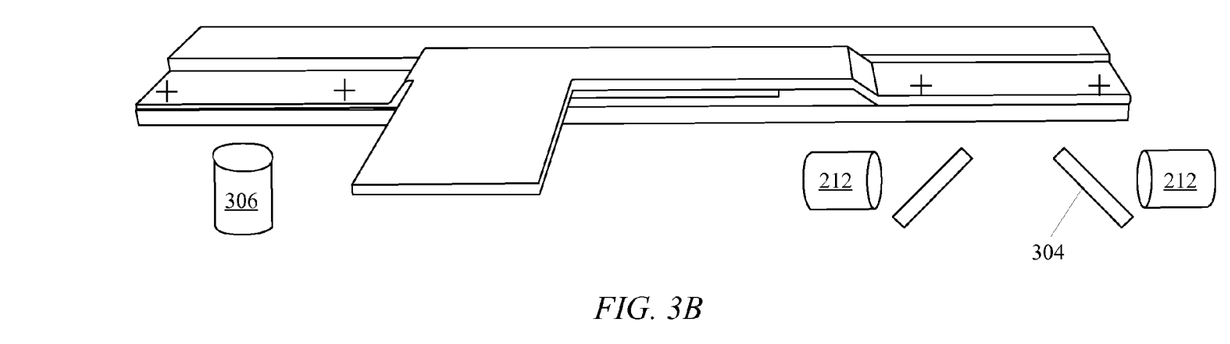
FIG. 3B illustrates an alternate configuration for positioning a number of CCDs.

As a result of squeezing components into tighter and tighter spaces in some embodiments there may not be enough space beneath TFT glass 206 for CCDs 212. In such an eventuality FIG. 3B shows a work around. FIG. 3B shows how a series of optics can be arranged to position CCDs 212 in a position that allows viewing of fiducials 302. In one embodiment a CCD 212 can be offset laterally from underneath TFT glass 206. Mirror 304 can be configured at a 45 degree angle allowing a field of view of CCD 212 to see alignment of fiducials 302. In another embodiment one CCD 212 can be configured to view two pairs of fiducials 302. A series of mirrors can split light collected by CCD 212 into two halves one half showing alignment of a first set of fiducials 302 and another half of the field of view configured to view a second set of fiducials 302. Finally, in yet another embodiment a single wide field of view CCD 306 can be configured to view two sets of fiducials 302.

Figure 4:
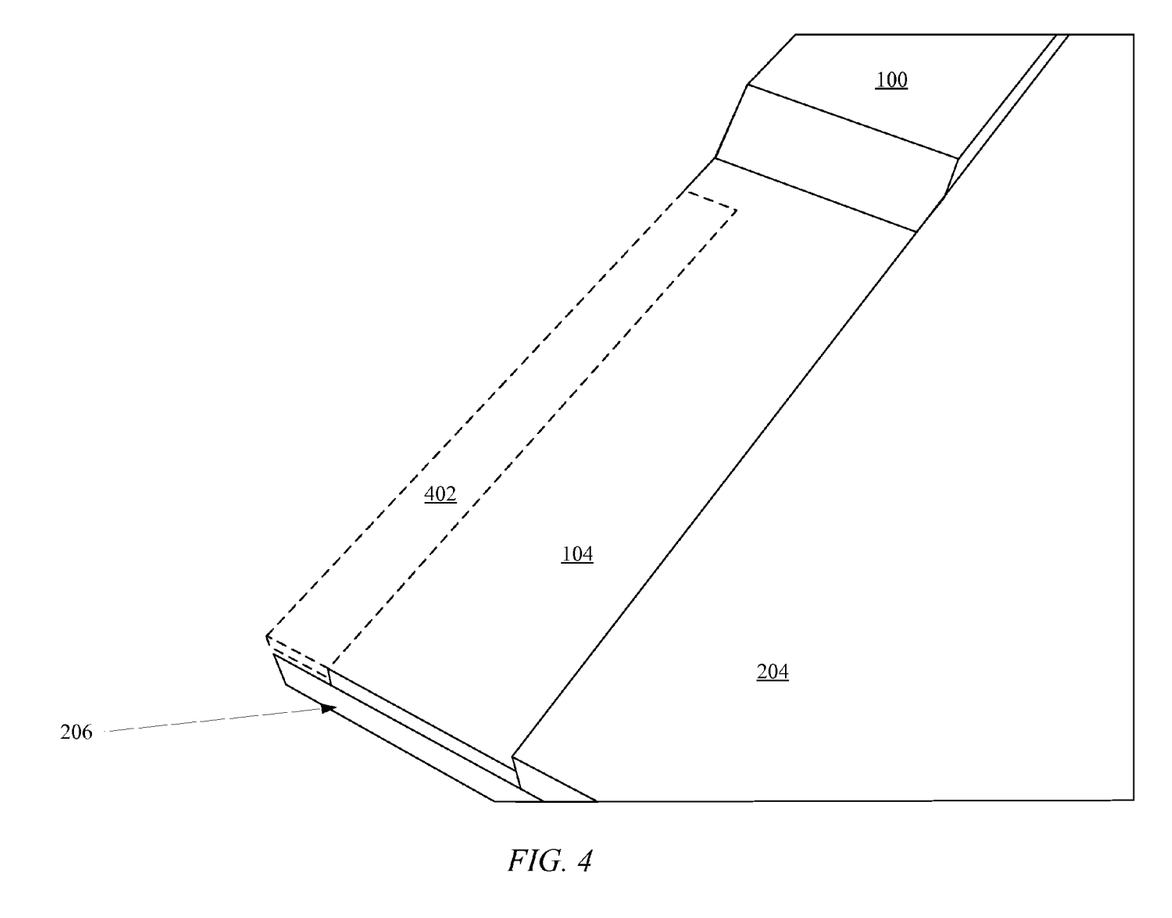
FIG. 4 illustrates a perspective view of a landing position for a hot bar on a flexible circuit.

FIG. 4 illustrates a landing position 402 for a hot bar to complete a final bonding operation between attaching surface 104 and TFT ledge 202. Landing portion 402 is a target position for a hot bar (not depicted) to come into contact with, thereby resulting in heating and compression of ACF layer and electrical connection of flexible circuit 100 with TFT touch sensor contacts arranged on TFT ledge 202. Landing portion 402 of attaching surface 104 is designed to be thinner than the rest of flexible circuit 100 as a layer of coverlay has been removed from it. As a result heat from a hot bar can be transmitted more easily through landing portion 402, thereby reducing total heat expulsion and limiting duration and/or total heat imparted to display assembly 200. In one embodiment landing portion 402 can be marked out by visual guides on an upper surface of flexible circuit 100 to provide a visual target to indicate exactly what position the hot bar should be positioned in.

Figure 5:
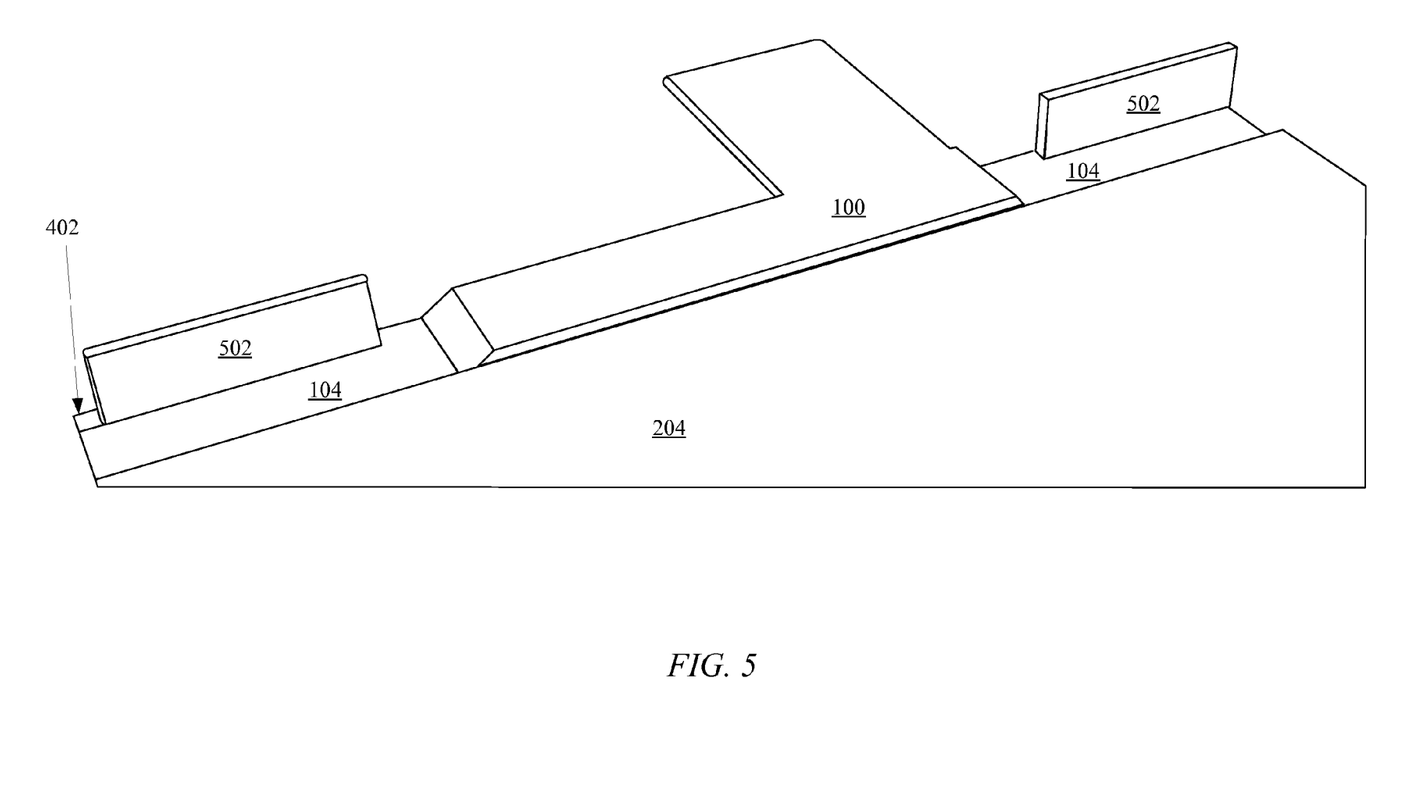
FIG. 5 illustrates a flexible circuit undergoing a final bonding operation.

FIG. 5 illustrates flexible circuit 100 undergoing a final bonding operation. Hot bars 502 are in contact with landing portions 402 of flexible circuit 100. By providing heat to a thin portion of flexible circuit 100 ACF disposed on a surface portion of TFT ledge 202 can be activated by both heat and pressure provided by hot bars 502. Hot bars 502 can assert pressure independently of one another, allowing pressure to be applied equally to both surfaces, thereby achieving a more consistent bond than would otherwise be achieved by a single hot bar with two contact positions. In some embodiments the positioning of hot bars 502 can also be influenced by CCDs 212 which can track the position of hot bars 502 in relation to fiducials 302, thereby providing another indication of proper placement of hot bars 502.

Figure 6A:
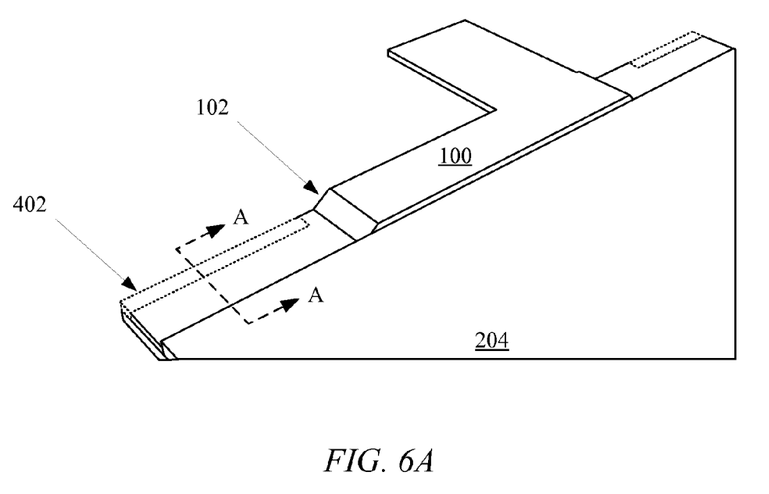
FIG. 6A illustrates a perspective view of a flexible circuit attached to a display assembly.
Figure 6B:
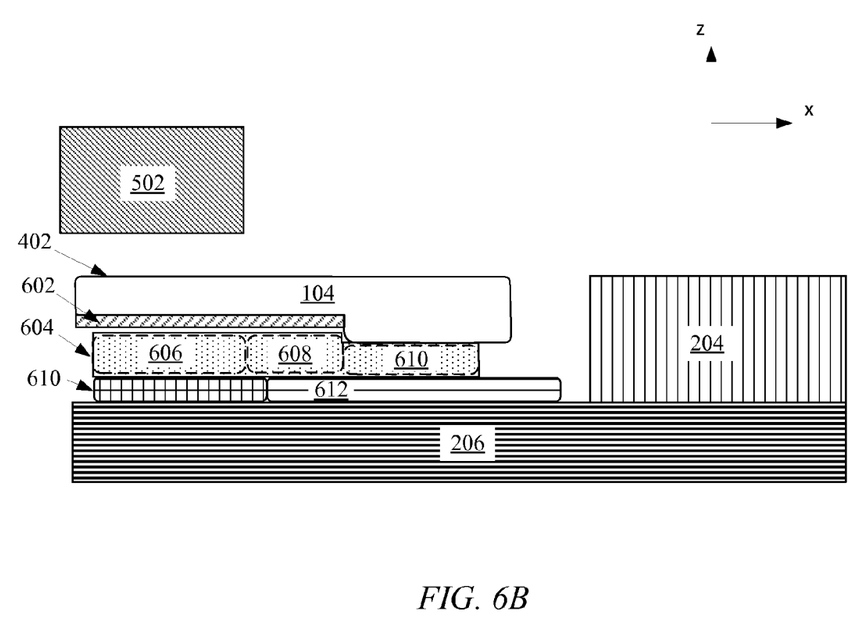
FIG. 6B illustrates a cross-sectional side view of a flexible circuit and display assembly as defined by cross-section A-A from FIG. 6A.

FIG. 6A illustrates a perspective view of flexible circuit 100 attached to display assembly 200. It should be noted that in this depicted embodiment landing position 402 does not extend all the way to pre-bent portion 102, thereby preventing deformation of pre-bent portion 102 or even worse damage to display driver IC 210 from inadvertent contact with a hot bar. Of further interest, cross-section A-A cuts through a portion of flexible circuit 100 and TFT ledge 202. FIG. 6B shows a cross-sectional side view of flexible circuit 100 and display assembly 200 as defined by cross-section A-A from FIG. 6A. Attaching surface 104 is shown having various thicknesses in this view. This is due in part to removal of coverlay from a portion of a lower surface of attaching surface 104, thereby making flexible circuit 100 thinner and in some embodiments exposing electrical connector 602 of attaching surface 104. Arranged underneath attaching surface 104 is ACF layer 604. ACF layer 604 acts as a bonding agent between attaching surface 104 and bond pad 610. Bond pad 610 is configured to route signals touch inputs from trace layer 612, through crush portion 606 of ACF layer 604 into electrical connector 602. ACF layer 604 is adhesively and conductively activated by a combination of pressure and heat. Hot pad 502 can be lowered to exert pressure and heat on a thin portion of attaching surface 104. In this way hot pad 502 can conductively transfer heat and exert pressure on ACF layer 604, thereby finalizing a bond between the two substrates.

It should be noted that coverlay can be removed from attaching surface 104 to make heat transfer between hot bar 502 and ACF layer 604 more efficient. Furthermore, this thinning of attaching surface 104 makes it more imperative that positioning of hot bar 502 in the X-axis is quite precise. If hot bar 502 exerts pressure upon a thicker portion of attaching surface 104 an excessive amount of force can be transferred through portion 610 of ACF layer 604 due to the increased thickness of attaching surface 104, thereby resulting in possible puncture of trace layer 612. Puncture of trace layer 612 can result in an undesirable higher likelihood of electrical shorts.

Figure 7:
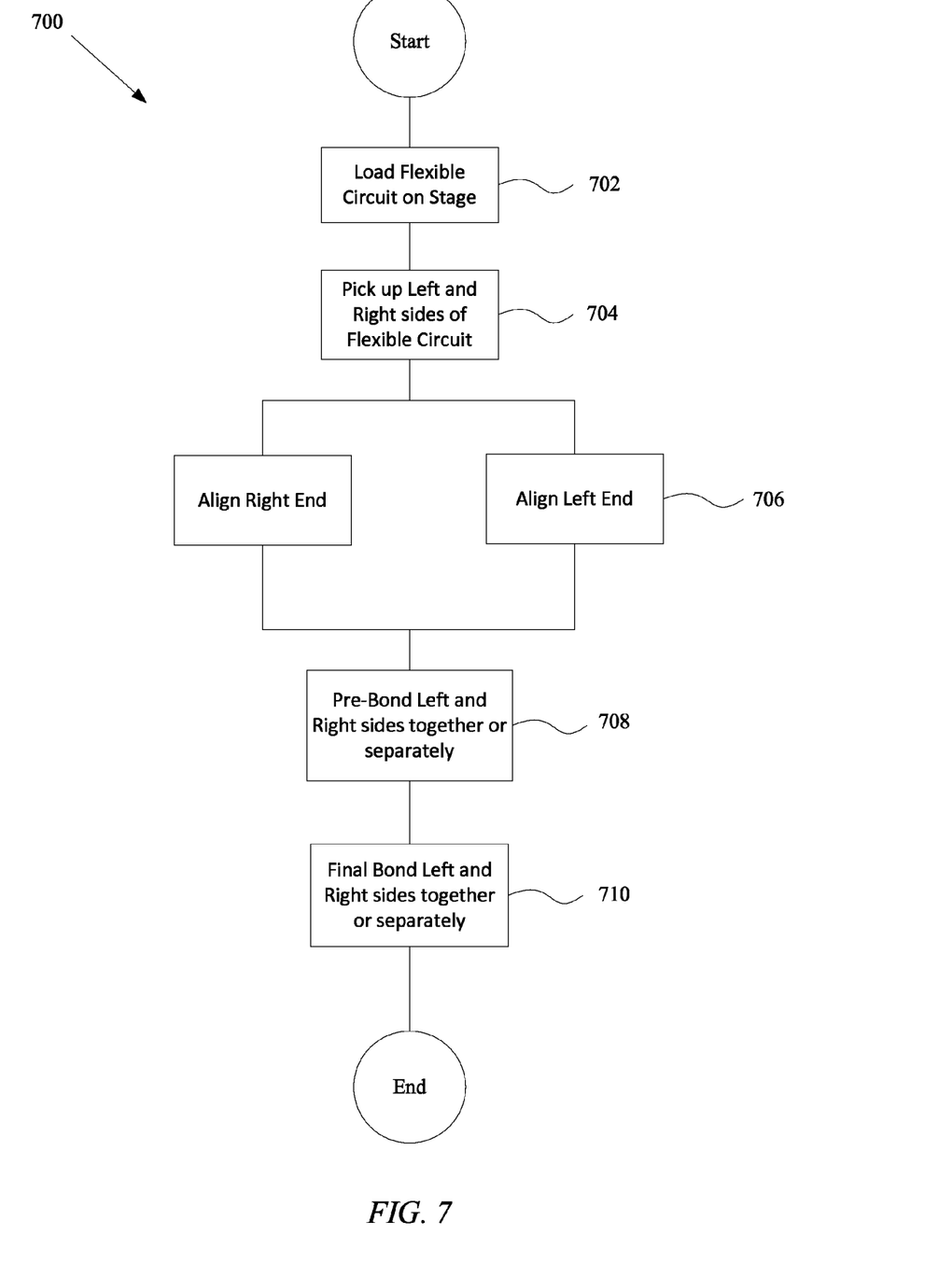
FIG. 7 shows a flowchart detailing an assembly process 700 for combining touch sensor input signals from disparate portions of a touch sensor.

FIG. 7 shows a flowchart detailing an assembly process 700 for combining touch sensor inputs from disparate portions of a touch sensor. In a first step 702 a flexible circuit is loaded onto a precision stage. The flexible circuit includes two lateral connectors capable of merging two signals into one receiving channel. The precision stage can be adjusted to set an initial geometry of the flexible circuit. At step 704 at least two vacuum chucks are used to pick up a left and right side of the flexible circuit. The left and right vacuum chucks can be configured to maintain an initial spacing relationship established when they pick up each side of the flexible stage. In this way the flexible circuit can be transferred from the precision stage to just above a TFT glass substrate. The TFT glass substrate can include a series of bonding pads on a TFT ledge of a display assembly to adhesively attach to the flexible circuit in at least two positions on the TFT ledge. In this way touch sensor inputs can be combined into one signal conduit in order to allow combination of touch sensor inputs from two regions of the touch sensor.

Once vacuum chucks are positioned above the TFT ledge step 706 begins in which vacuum chucks are maneuvered to properly align electrical connectors on the flexible circuit with TFT connectors on disposed on the TFT ledge. This alignment can be accomplished manually or in an automated fashion. Alignment is facilitated by inclusion of at least two fiducials on each side of the flexible circuit and four corresponding fiducials disposed on the TFT ledge. CCDs can be arranged to direct movement of the vacuum chucks with respect to the TFT ledge. Once each of the fiducials is aligned the vacuum chucks can deposit the flexible circuit onto the TFT ledge at step 708. The electrical connectors disposed on the TFT ledge can be covered with an anisotropic conductive film (ACF) layer. Consequently, when the vacuum chucks deposit the flexible circuit on the TFT ledge they can do so while exerting force between the flexible circuit and the ACF layer resulting in a pre-bond being formed that keeps the flexible circuit safely in place until a final bond can be accomplished. After the vacuum chucks disengage from the flexible circuit at step 710 hot bars can be introduced on a specific portion of the flexible circuit where a coverlay portion has been removed. Removal of the coverlay portion increases heat transfer efficiency between the hot bars and the ACF layer, thereby allowing for more quickly achieving a final bond. Once the ACF layer has been heated and compressed so that internal particles within the layer are squeezed closer together, yielding increased conductivity, the final bonding of the flexible circuit to the TFT ledge is complete.

Figure 8:
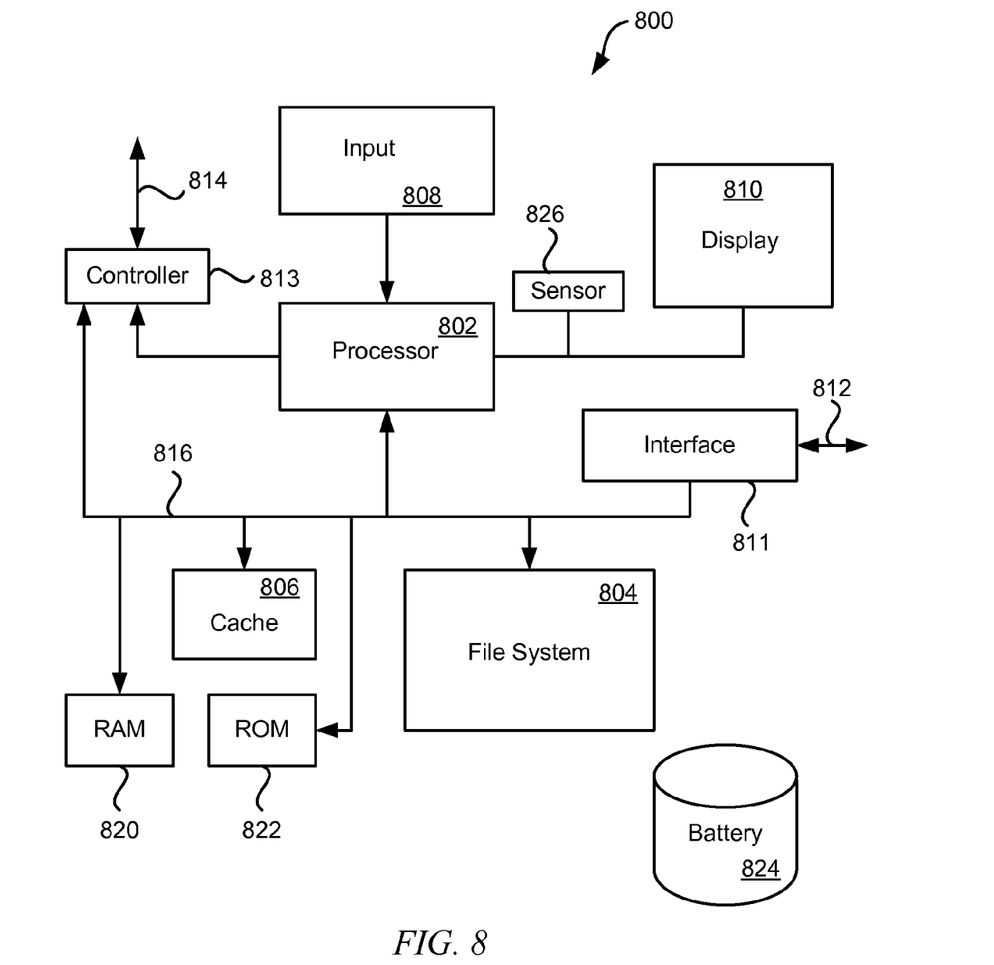
FIG. 8 is a block diagram of an electronic device suitable for controlling some of the processes in the described embodiments.

FIG. 8 is a block diagram of an electronic device suitable for controlling some of the processes in the described embodiment. Electronic device 800 can illustrate circuitry of a representative computing device. Electronic device 800 can include a processor 802 that pertains to a microprocessor or controller for controlling the overall operation of electronic device 800. Electronic device 800 can include instruction data pertaining to manufacturing instructions in a file system 804 and a cache 806. File system 804 can be a storage disk or a plurality of disks. In some embodiments, file system 804 can be flash memory, semiconductor (solid state) memory or the like. The file system 804 can typically provide high capacity storage capability for the electronic device 800. However, since the access time to the file system 804 can be relatively slow (especially if file system 804 includes a mechanical disk drive), the electronic device 800 can also include cache 806. The cache 806 can include, for example, Random-Access Memory (RAM) provided by semiconductor memory. The relative access time to the cache 806 can substantially shorter than for the file system 804. However, cache 806 may not have the large storage capacity of file system 804. Further, file system 804, when active, can consume more power than cache 806. Power consumption often can be a concern when the electronic device 800 is a portable device that is powered by battery 824. The electronic device 800 can also include a RAM 820 and a Read-Only Memory (ROM) 822. The ROM 822 can store programs, utilities or processes to be executed in a non-volatile manner. The RAM 820 can provide volatile data storage, such as for cache 806

Electronic device 800 can also include user input device 808 that allows a user of the electronic device 800 to interact with the electronic device 800. For example, user input device 808 can take a variety of forms, such as a button, keypad, dial, touch screen, audio input interface, visual/image capture input interface, input in the form of sensor data, etc. Still further, electronic device 800 can include a display 810 (screen display) that can be controlled by processor 802 to display information to the user. Data bus 816 can facilitate data transfer between at least file system 804, cache 806, processor 802, and controller 1013. Controller 1013 can be used to interface with and control different manufacturing equipment through equipment control bus 814. For example, control bus 814 can be used to control a computer numerical control (CNC) mill, a press, an injection molding machine or other such equipment. For example, processor 802, upon a certain manufacturing event occurring, can supply instructions to control manufacturing equipment through controller 1013 and control bus 814. Such instructions can be stored in file system 804, RAM 820, ROM 822 or cache 806.

Electronic device 800 can also include a network/bus interface 1011 that couples to data link 812. Data link 812 can allow electronic device 800 to couple to a host computer or to accessory devices. The data link 812 can be provided over a wired connection or a wireless connection. In the case of a wireless connection, network/bus interface 1011 can include a wireless transceiver. Sensor 1026 can take the form of circuitry for detecting any number of stimuli. For example, sensor 1026 can include any number of sensors for monitoring a manufacturing operation such as for example a Hall Effect sensor responsive to external magnetic field, an audio sensor, a light sensor such as a photometer, computer vision sensor to detect clarity, a temperature sensor to monitor a molding process and so on.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:
1. A method for aligning and bonding a flexible circuit having a plurality of attaching surfaces to a plurality of mounting areas, the method comprising:
   pre-positioning the flexible circuit in a geometry substantially the same as a final geometry taken by the flexible circuit once it is bonded to the plurality of mounting areas;
   securing the flexible circuit to a securing mechanism, the securing mechanism having at least as many securing areas as there are attaching surfaces;

concurrently lifting a first attaching surface and a second attaching surface using the securing mechanism;

aligning the first attaching surface with a first mounting area and the second attaching surface with a second mounting area; and bonding the first attaching surface to the first mounting area and the second attaching surface to the second mounting area.

2. The method as recited in claim 1, wherein the securing mechanism comprises:

a first vacuum chuck; and a second vacuum chuck, wherein the securing the flexible circuit comprises attaching the first vacuum chuck to the first attaching surface and attaching the second vacuum chuck to the second attaching surface.

3. The method as recited in claim 2, wherein an optical guidance system is utilized to align the first attaching surface with the first mounting area, and wherein the optical guidance system comprises:

a plurality of fiducials disposed on the plurality of attaching surfaces, each of the plurality of attaching surfaces having at least one fiducial corresponding to a fiducial disposed proximate to one of the plurality of mounting areas; and a plurality of CCD cameras, providing optical guidance by supplying at least an input to the first and second vacuum chucks when one of the plurality of fiducials is in alignment.

4. The method as recited in claim 3, wherein at least one of the plurality of CCD cameras is able to view one of the plurality of fiducials by way of a mirror.

5. The method as recited in claim 3, wherein at least one of the plurality of CCD cameras is able to view two complementary pairs of fiducials by way of a series of mirrors splitting a field of view of the at least one CCD camera into two portions.

6. The method as recited in claim 3, wherein each of the plurality of mounting areas comprises:

a bonding pad electrically coupled to a touch sensor; and a conductive, pressure sensitive adhesive strip overlaying the bonding pad.

7. The method as recited in claim 6, further comprising:

prior to the bonding step applying force between the first attaching surface and the bonding pad corresponding to the first mounting area, the resulting pressure yielding a pre-bond that at least temporarily joins the first attaching surface to the first mounting area.

8. The method as recited in claim 1, wherein the second attaching surface is aligned independent of the first attachment surface.

9. The method as recited in claim 8, wherein the flexible circuit is pre-positioned upon a stage, and wherein a portion of the stage has a shape substantially similar to an obstruction around which the flexible circuit is routed.

10. The method as recited in claim 4, wherein the bonding of the first and second attaching surfaces comprises using a first and second hot bar to bond the first and second attaching surfaces to the first and second mounting areas.

11. A method for attaching a flexible circuit to an electrical component, the method comprising:

pre-positioning a flexible circuit on a stage having substantially the same geometry as a portion of the electrical component to which the flexible circuit is configured to be attached, the flexible circuit comprising a first attachment surface and a second attachment surface;

securing the flexible circuit with a first vacuum chuck and a second vacuum chuck;

lifting the flexible circuit off the stage and concurrently aligning the first attachment surface and the second attachment surfaces to alignment indicia arranged on a first surface of the electrical component and a second surface of the electrical component with the first vacuum chuck attached to the first attachment surface and the second vacuum chuck attached to the second attachment surface;

pressing the first attachment surface onto the first surface and the second attachment surface onto the second surface of the electrical component; and bonding the first attachment surface to the first surface and the second attachment surface to the second surface.

12. The method as recited in claim 11, further comprising:

maintaining a relative position between the first and second attachment surfaces when transporting the flexible circuit from a position over the stage to a position over the first and second surfaces of the electrical component.

13. The method as recited in claim 12, wherein the alignment indicia are fiducials arranged on both the first and second attachment surfaces and on the first and second surfaces of the electrical component.

14. The method as recited in claim 11, wherein the electrical component comprises:

a plurality of electrical contacts disposed across the first and second surfaces of the electrical component; and a plurality of conductive, pressure sensitive adhesive strips disposed over the plurality of electrical contacts.

* * * * *